(12) United States Patent
Zanotto et al.

(10) Patent No.: US 9,086,210 B2
(45) Date of Patent: Jul. 21, 2015

(54) LIGHTING MODULE AND CORRESPONDING INTEGRATED LIGHTING DEVICE

(71) Applicant: OSRAM GmbH, Munich (DE)

(72) Inventors: Alberto Zanotto, Padua (IT); Dina Pasqualini, Udine (IT)

(73) Assignee: Osram GmbH, Munich (DE)

( * ) Notice: Subject to any disclaimer, the term of this patent is extended or adjusted under 35 U.S.C. 154(b) by 101 days.

(21) Appl. No.: 13/906,452

(22) Filed: May 31, 2013

(65) Prior Publication Data

US 2013/0335964 A1    Dec. 19, 2013

(30) Foreign Application Priority Data

Jun. 1, 2012   (IT) .............. TO2012A0482

(51) Int. Cl.

| | | |
|---|---|---|
| *F21V 21/00* | (2006.01) | |
| *F21V 13/04* | (2006.01) | |
| *F21V 5/08* | (2006.01) | |
| *F21V 19/02* | (2006.01) | |
| *H05K 1/14* | (2006.01) | |
| *F21Y 101/02* | (2006.01) | |
| *H05K 1/02* | (2006.01) | |

(52) U.S. Cl.
CPC . *F21V 13/04* (2013.01); *F21V 5/08* (2013.01); *F21V 19/02* (2013.01); *H05K 1/0295* (2013.01); *H05K 1/142* (2013.01); *F21Y 2101/02* (2013.01); *H05K 1/0274* (2013.01); *H05K 2201/049* (2013.01); *H05K 2201/10106* (2013.01)

(58) Field of Classification Search
CPC ................. F21V 5/08; F21Y 2101/00; H05K 2201/10106
USPC ............................ 362/249.01, 249.02, 249.03
See application file for complete search history.

(56) References Cited

U.S. PATENT DOCUMENTS

| | | | | |
|---|---|---|---|---|
| 7,993,036 | B2 * | 8/2011 | Holder et al. ............ | 362/311.02 |
| 8,430,538 | B2 * | 4/2013 | Holder et al. ............ | 362/311.02 |
| 2003/0099115 | A1 * | 5/2003 | Reill ........................ | 362/555 |
| 2004/0218388 | A1 * | 11/2004 | Suzuki ..................... | 362/231 |
| 2008/0239722 | A1 * | 10/2008 | Wilcox ..................... | 362/268 |

FOREIGN PATENT DOCUMENTS

| | | |
|---|---|---|
| JP | 2008103300 A | 5/2008 |
| WO | 2011149237 A2 | 12/2011 |

OTHER PUBLICATIONS

English abstract of WO 2011149237 A2, dated Dec. 1, 2011.
English abstract of JP 2008103300 A, dated May 1, 2008.

* cited by examiner

*Primary Examiner* — Ali Alavi

(57) ABSTRACT

A lighting module includes a base structure and a plurality of light points configured to generate light radiation, wherein the light points are coupled to the base structure, wherein the lighting module comprises at least one light point which has a radiation pattern with rotational asymmetry, and wherein the base structure and the light point are configured to couple the light point to the base structure with different orientations.

11 Claims, 6 Drawing Sheets

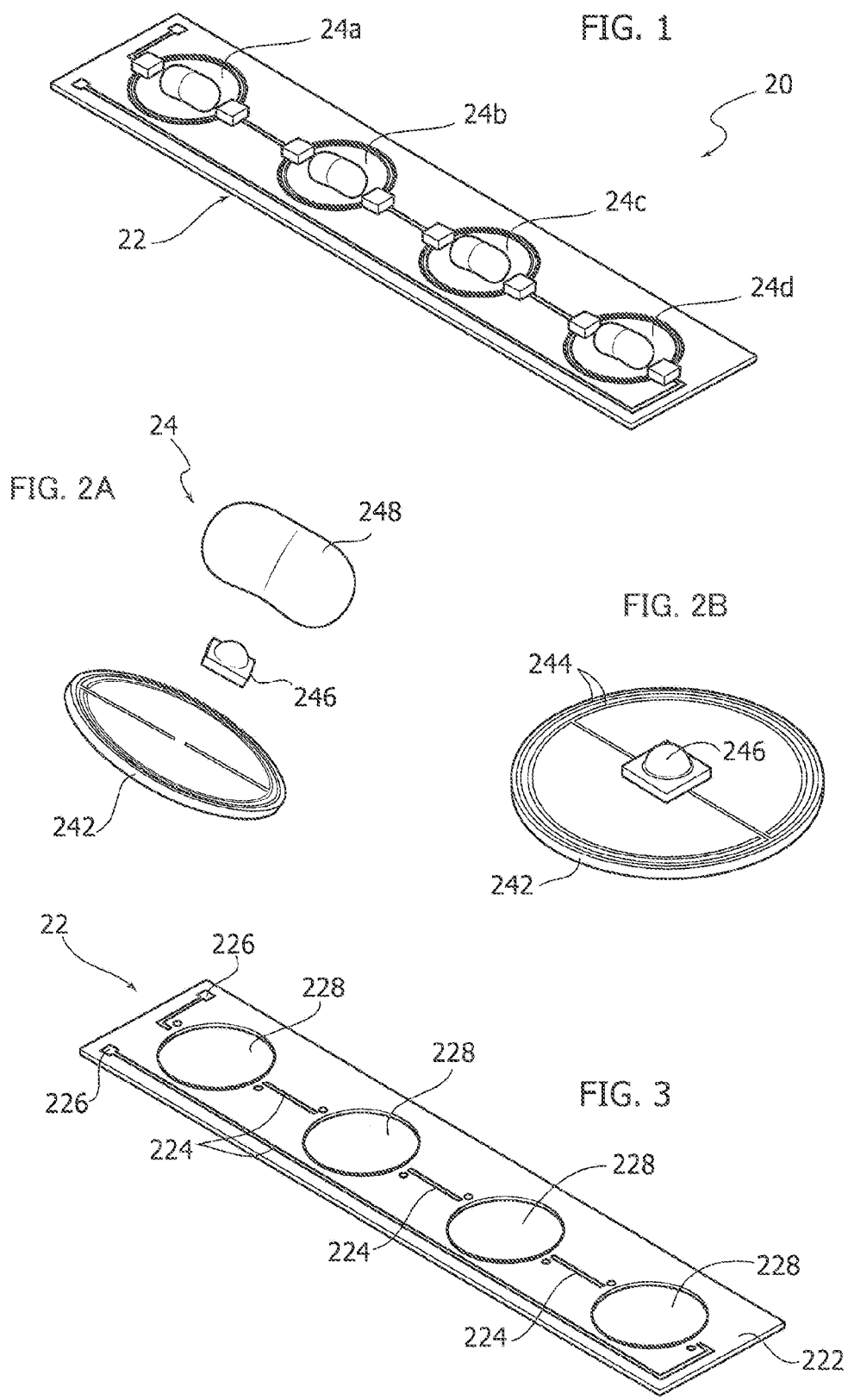

248

L=0°
L=90°

248

—— L=0°
—— L=90°

LIGHTING MODULE AND CORRESPONDING INTEGRATED LIGHTING DEVICE

RELATED APPLICATION

The present application claims priority from Italian application No.: TO2012A000482 filed on Jun. 1, 2012.

TECHNICAL FIELD

Various embodiments relate to lighting modules.

Various embodiments provide lighting modules in which the distribution of the emitted light is modifiable.

PRIOR ART

There are known lighting modules comprising at least one light source, such as one or more LEDs (Light Emitting Diodes) or other solid state lighting means mounted on a printed circuit board (PCB).

Typically, a lighting module further comprises optical means such as lenses or reflectors configured to determine the distribution of the light emitted by the light sources.

The distribution of the emitted light is therefore typically predetermined and is dependent on the specific optical means used.

Therefore, in order to change the distribution of the emitted light, either these optical means must be replaced with other optical means, or the position of the light source relative to the optical means must be modified.

SUMMARY

Various embodiments provide solutions which enable the distribution of the light emitted by a lighting module to be varied without the need to change components of the lighting module. Various embodiments also relate to a corresponding integrated lighting device.

In various embodiments, use is made of a lighting module comprising a base structure and a plurality of light points which generate light radiation.

As a general rule, these light points are coupled to the base structure, which may, for example, be a printed circuit board. However, in order to allow modification of the radiation pattern of the lighting module, at least one light point has a radiation pattern with rotational asymmetry. Furthermore, the base structure allows the light point to be coupled with different orientations. Consequently, the same light point can have different orientations with respect to the base structure, and therefore, because of the asymmetry in the radiation pattern of the light point, the radiation pattern of the whole lighting module can be modified.

For example, in various embodiments, the light point includes a light source, such as an LED, coupled rigidly to a support. The light point further comprises optical means, such as a lens or a reflector, which have a radiation pattern with rotational asymmetry. The rotational asymmetry of the light point is therefore created by these optical means.

In various embodiments, the orientation of the light point can be set in a continuous manner; in other words, the light point can be rotatable with respect to the base structure. For example, in various embodiments, the support of the light point has a circular cross section, and the base structure comprises at least one cavity which has a shape substantially complementary to the shape of the support of the light point.

Finally, in order to allow the rotation of the light point, in various embodiments, the electrical connection between the light point and the base structure is provided by means of a slidable connection.

The whole of the light point, and not just the lens, can therefore be rotatable. Indeed, the inventors have observed that it is difficult to rotate the lenses and/or reflectors separately, because they typically have mechanical attachment systems (such as clips or pins) for securing them rigidly to the PCB or to the casing and for positioning them correctly with respect to the LED.

BRIEF DESCRIPTION OF THE DRAWINGS

Various embodiments will now be described, purely by way of non-limiting example, with reference to the appended drawings, of which:

FIG. 1 shows a lighting module according to the disclosed embodiment,

FIGS. 2A to 2B, 3, 4, 5A to 5C and 6A to 6C show miscellaneous details of the lighting module of FIG. 1, and FIGS. 7A to 7F show different configurations that can be obtained with the lighting module of FIG. 1.

DETAILED DESCRIPTION

Figure 4:
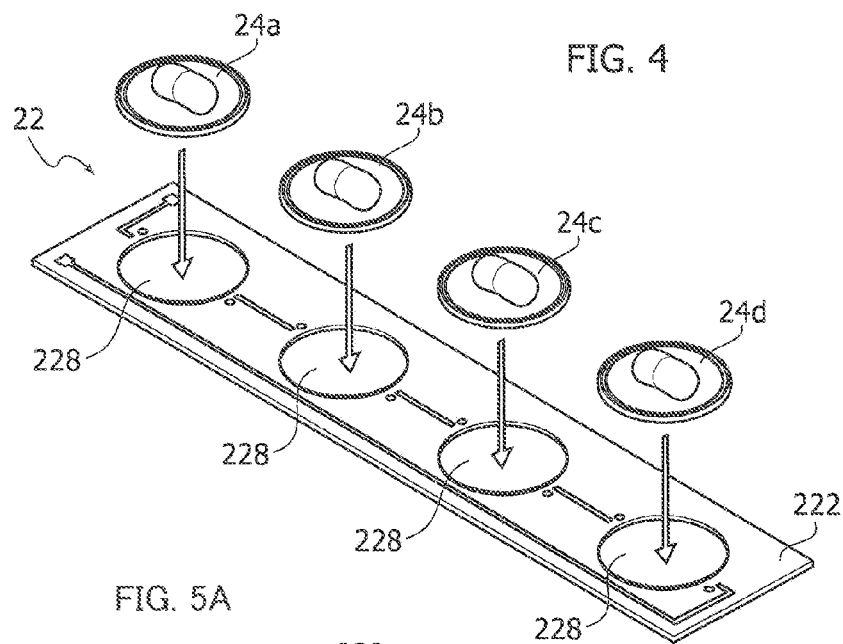

The following description illustrates various specific details intended to provide a clearer understanding of the embodiments. The embodiments may be produced without one or more of the specific details, or may use other methods, components, materials, etc. In other cases, known structures, materials or operations are not shown or described in detail, in order to avoid obscuring various aspects of the embodiments.

The reference to "an embodiment" in this description is intended to indicate that a particular configuration, structure or characteristic described in relation to the embodiment is included in at least one embodiment. Therefore, phrases such as "in one embodiment", which may be present in various parts of this description, do not necessarily refer to the same embodiment. Furthermore, specific formations, structures or characteristics may be combined in a suitable way in one or more embodiments. The references used herein are provided purely for convenience and therefore do not define the scope of protection or the extent of the embodiments.

As mentioned above, the present description can be used to produce solutions in which the distribution of the emitted light is modifiable.

FIG. 1 shows a possible embodiment of a lighting module 20 of this type, which comprises a plurality of light points 24.

For example, in the embodiment under consideration, the lighting module 20 comprises a base structure 22 and four light points 24a, 24b, 24c and 24d.

In various embodiments, one or more of these light points 24 can be rotated or pivoted with respect to the base structure 22. In particular, in various embodiments, these rotatable light points 24 have a radiation pattern with rotational asymmetry. The orientation of the radiation profile of a light point 24 can therefore be modified by rotating the respective light point 24. However, a change in the radiation pattern of a light point 24 also affects the radiation pattern of the whole lighting module 20; in other words, the radiation pattern of the whole lighting module 20 can be modified by controlling the orientation of the light points 24.

FIGS. 2A and 2B show a possible embodiment of a light point 24. In the embodiment considered here, the light point 24 comprises a light source 246, such as an LED, which is mounted on a support 242.

For example, in one embodiment (see, in particular, FIG. 2B), the support 242 is a printed circuit board which comprises electrical tracks 244 for powering the light source 246. For example, this printed circuit board 242 can be made of FR4 or could also have a metal core.

In the embodiment considered here, the rotational asymmetry in the radiation pattern of the light point 24 is created by optical means 248 which are mounted in the path of the light emitted by the source 246.

In particular, according to the present description, these optical means 248 have rotational asymmetry. For example, lenses or reflectors having different radiation patterns in two transverse directions can be used for this purpose.

In particular, in the embodiment considered here, the light source 246 and the optical means, in other words the lens 248, are coupled rigidly to the support 242.

FIG. 3 shows a possible embodiment of the base structure 22. In the embodiment considered here, the base structure 22 comprises a printed circuit board 222. For example, in one embodiment, this printed circuit board 222 comprises electrical tracks 224 for powering the light sources 24. For example, in the embodiment considered here, these electrical tracks 224 are connected to two contacts 226 which, in turn, can be used for connection to an electronic converter.

The base structure 22 also comprises means for supporting the light points 24. These support means enable a light point 24 to be coupled to the base structure 22 in different orientations. For example, in the embodiment considered here, the printed circuit board 222 comprises, for each light point 24, a cavity 228 which has a cross section substantially complementary to the cross section of the support 242 of the light point 24. For example, in the embodiment considered here, the support 242 is disk-shaped; in other words, it has a circular cross section, and therefore the cavities 228 also have circular cross sections. These cavities 228 are preferably equidistant from each other. In various embodiments, the printed circuit board 222 is fastened to the casing of the lighting module 20 or to another supporting structure. For example, the printed circuit board 222 could be mounted on a heat sink. Additionally, the printed circuit board 222 could be mounted together with a respective electronic converter within an integrated lighting system.

As also shown in FIG. 4, the light points 24 are inserted into these cavities 228. Consequently, in the embodiment considered here, the support 242 of a light point 24 can be rotated directly within the respective cavity 228.

In general, however, supports 242 and cavities 228 of other shapes can also be used. For example, in one embodiment, the supports 242 and the cavities 228 have cross sections in the form of a regular polygon. In this case, the light point 24 is not directly rotatable within the cavity 228, but the light point 24 can be removed from the cavity 228 and can be reinserted with a different orientation.

Furthermore, it is not necessary for all the light points 24 to have the same shape. However, in order to make the system modular, it is preferable for all the supports 242 and cavities 228 to have the same shape.

Therefore, according to the present description, a light point 24 can be coupled to the base structure 22 with different orientations.

In various embodiments, after the orientation of the light point 24 has been set, the light point 24 is fastened by suitable fastening means to the base structure 22; in other words, these fastening means can be used to lock the movement, or the orientation, of a light point 24.

Figure 5A:
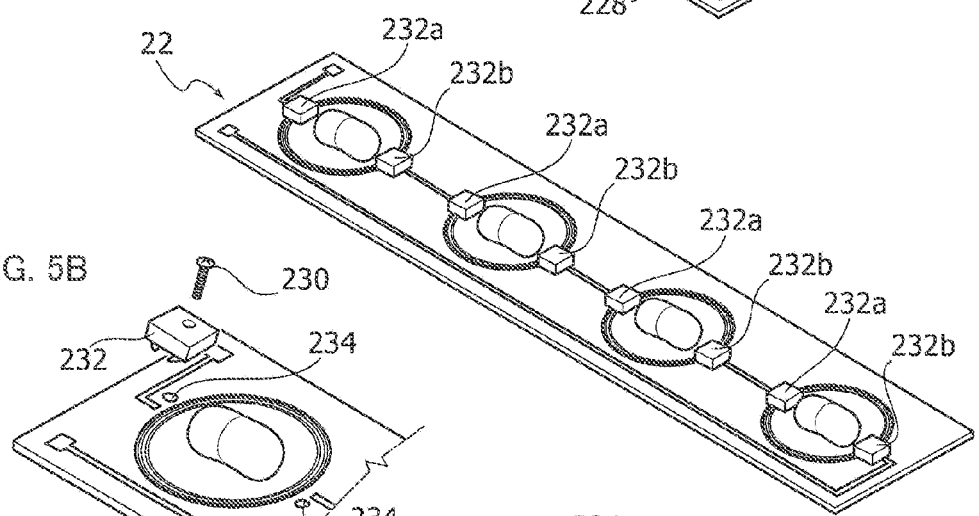
Figure 5B:
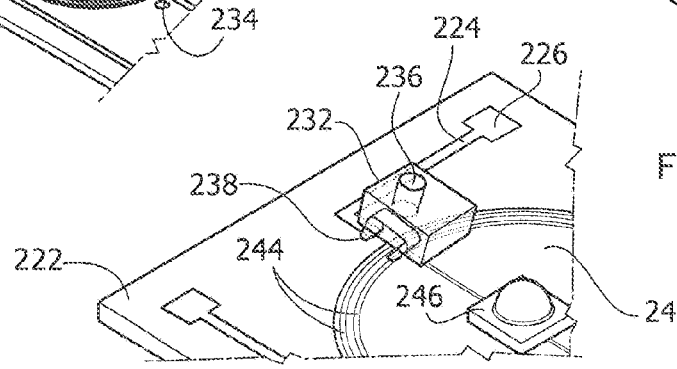
Figure 5C:

For example, FIGS. 5A to 5C show an embodiment in which the support 242 is fastened to the printed circuit board 222 by means of at least one screw 230.

In particular, in the embodiment considered here, this screw 230 interacts with a corresponding opening 234 in the base structure 22, in other words in the printed circuit board 222, and presses a locking element 232 against the support 242 of the light point 24. For example, in the embodiment considered here, the locking element 232 comprises a through hole 236 for this purpose.

As mentioned above, the printed circuit board 222 can be mounted on a support structure, such as a cooling body. In this case, the screw or screws 230 can be used to fasten the printed circuit board 222 simultaneously to this support structure.

In particular, in the embodiment considered here, the locking element 232 has a dual function. On one hand, the locking element 232 fastens the light point to the base structure and locks the movement of the light point 24. On the other hand, the locking element 232 is configured to provide the electrical connection between the base structure 22 and the light point 24, in other words between the tracks 224 of the printed circuit board 222 and the tracks 244 of the support 242. For this purpose, the locking element 232 comprises a metal element or is made at least partially of a metallic material. For example, in the embodiment considered here, the locking element is made in the form of a rectangular plastic parallelepiped and comprises within itself a metal link, such as a bent metal strip.

Additionally, as shown for example in FIGS. 3B and 5C, the electrical tracks 244 are preferably brought to the edge of the support 242 and enable the light point 24 to be electrically connected in different orientations; in other words, the electrical tracks 244 at least partially follow the edge of the support 242. For example, for a circular support 242, the electrical tracks 244 can follow the whole edge of the support 242, or can follow a circumferential line within the support 242. Consequently, in the embodiment considered here, the tracks 244 and the locking element 232 form a sliding contact. For this purpose, at least a part of the tracks 244 is exposed; in other words it is not covered by the solder mask or other insulating layers.

As a general rule, the locking element 232 may also comprise a plurality of metal elements 238, in order to provide a plurality of electrical contacts between the printed circuit board 222 and the light point 24.

However, in the embodiment considered here, the support 242 is fastened to the base structure 22 by means of two locking elements 232a and 232b, and each locking element 232 forms only one electrical contact. In this case, the locking elements 232a and 232b are preferably arranged on opposite sides of the support 242. For example, this type of fastening may be advantageous in the case in which the light points 24 are arranged in line and are electrically connected in series, this being a typical arrangement for what are known as linear LED modules.

As mentioned above, each light point 24 can comprise optical means 248, such as a lens or a reflector, which have rotational asymmetry. In this context, the rotational asymmetry relates to rotation about an axis which is perpendicular to the support 242. For example, this rotational asymmetry may be created by the shape of the lens and/or by the material used.

Figure 6A:
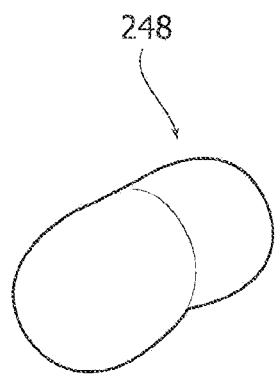
Figure 6B:
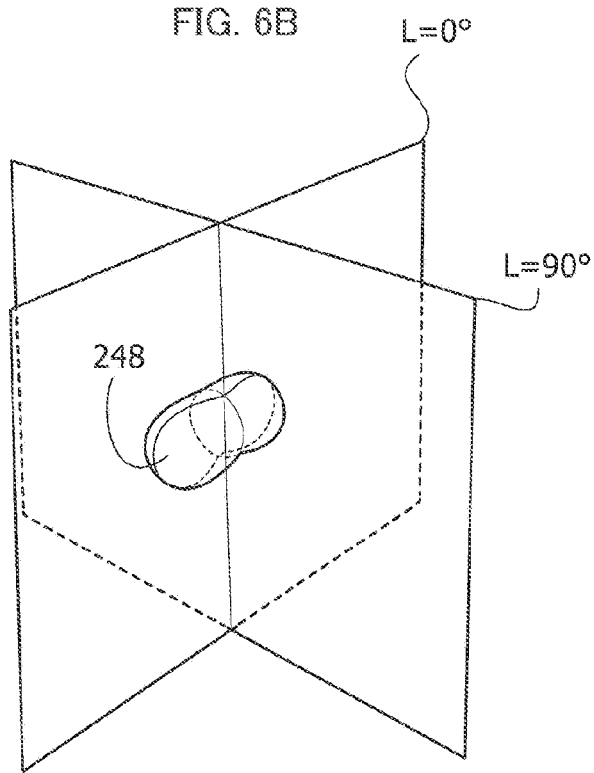
Figure 6C:
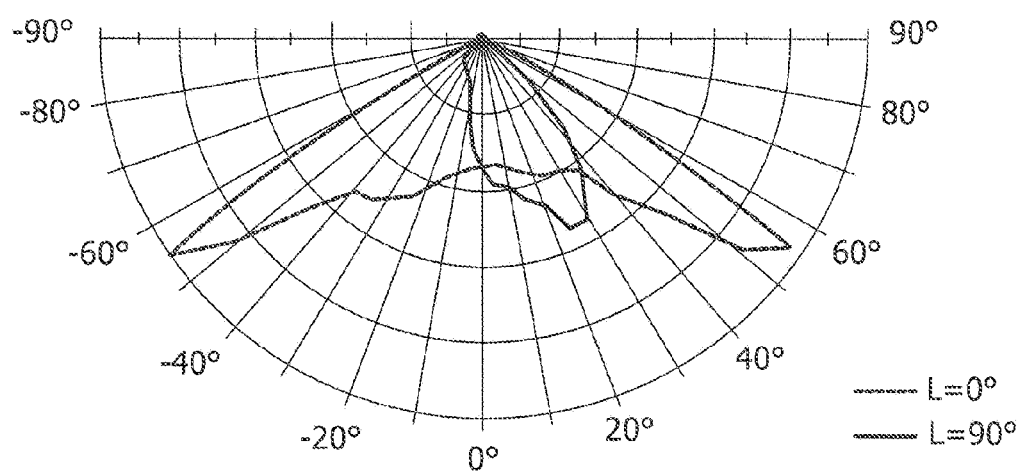

In this context, FIGS. 6A and 6C show an optical lens 248 which can be used for this purpose.

In the embodiment considered here, the lens 248 has a structure in the shape of a peanut, in other words a shape substantially formed by the intersection of two spheres.

For example, FIG. 6C shows the radiation pattern of the lens 248 in two orthogonal planes. For example, as shown in FIG. 6B, reference may be made to a first plane corresponding to the longitudinal direction (L=0°) and a second plane corresponding to the transverse direction (L=90°).

In particular, FIG. 6C shows the radiation pattern for these two planes, which in both cases depend on the angle of view with reference to the respective plane.

In particular, FIG. 6C shows that, in the embodiment considered here, the radiation patterns in these two orthogonal planes are different. Furthermore, whereas the radiation pattern in the longitudinal direction (L=0°) is substantially symmetrical, the radiation pattern in the transverse direction (L=90°) is asymmetrical.

Therefore, the rotational asymmetry of the lens 248, or of the optical means 248 in general, can have the following consequences:
 the radiation patterns differ between the longitudinal direction and the transverse direction, and/or
 the radiation pattern in the longitudinal and/or transverse direction is asymmetrical with respect to the axis of the angle of view.

FIGS. 7A to 7F show some examples of configurations that can be obtained with the lighting module 20 described above.

Figure 7A:
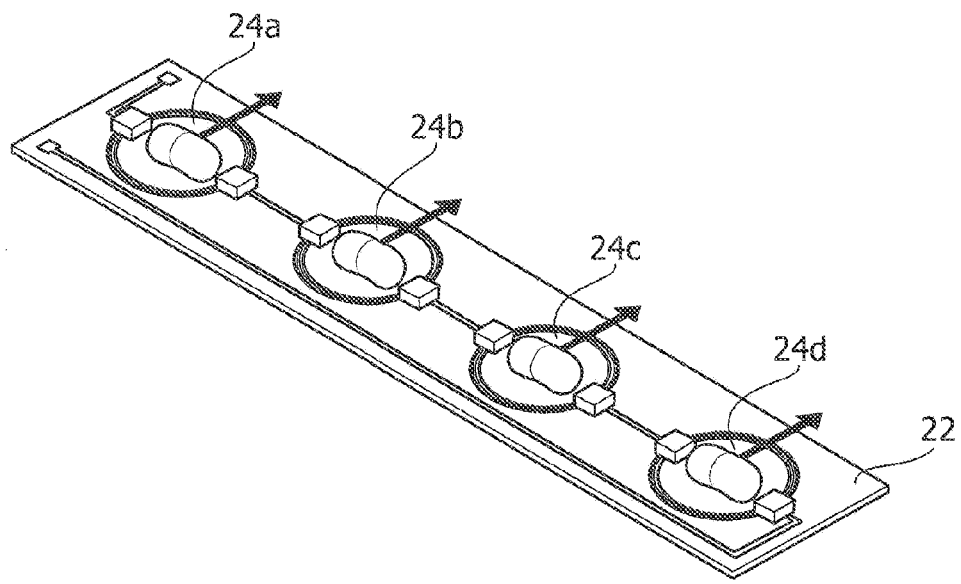

In particular, in the embodiment shown in FIG. 7A, all the light points 24 are in the initial position; in other words, the angle of rotation for all the light points 24 is 0°.

Figure 7B:
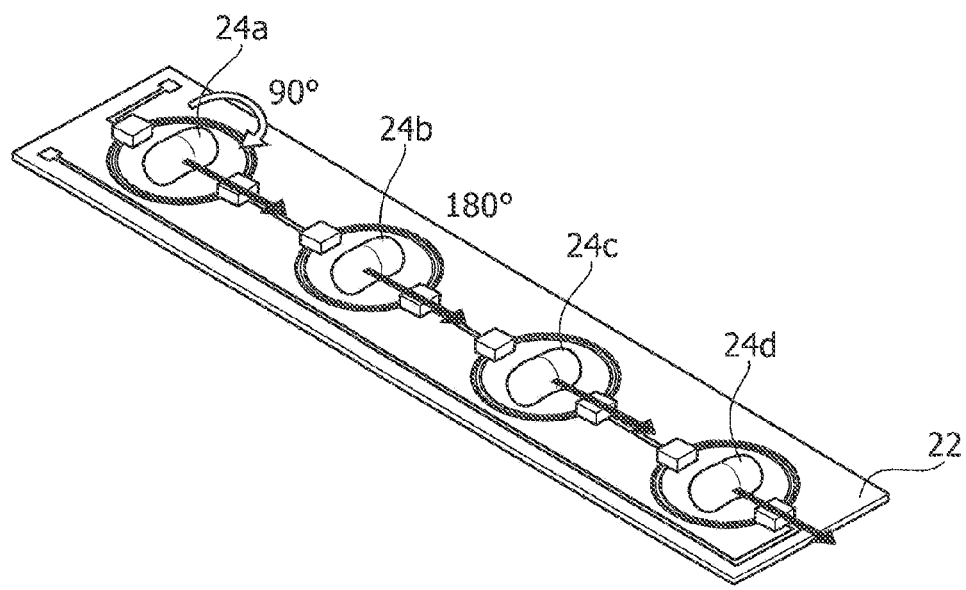
Figure 7C:
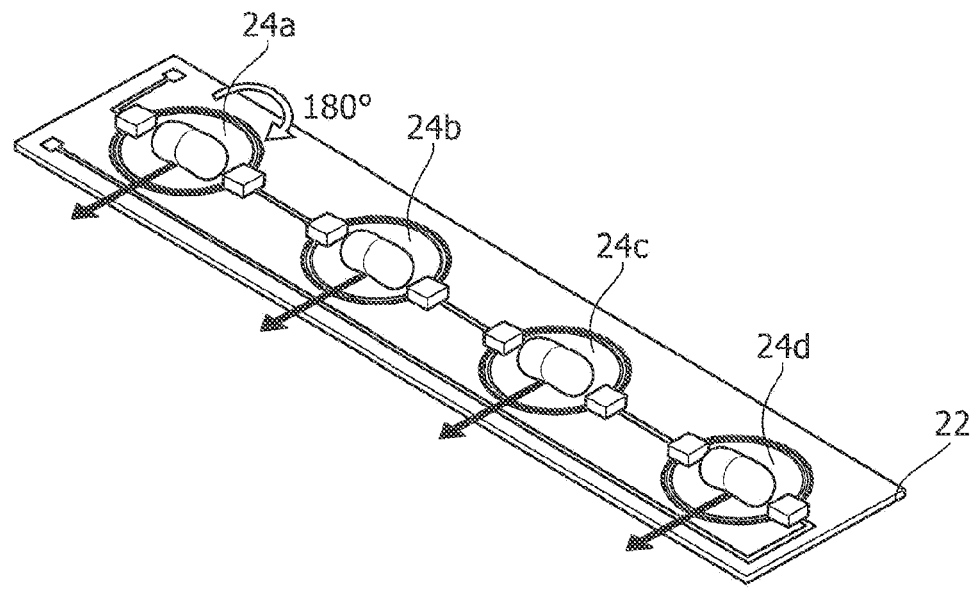
Figure 7D:
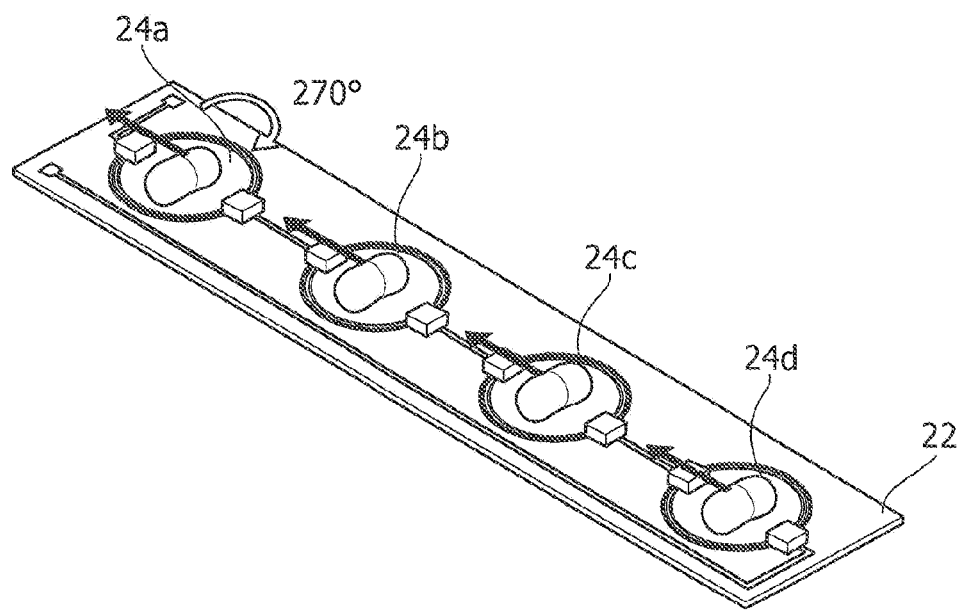

On the other hand, FIGS. 7B, 7C and 7D show embodiments in which the light points 24 have an angle of rotation of 90°, 180° and 270° respectively.

In particular, owing to the asymmetry of the radiation pattern in the transverse direction, the radiation pattern of the lighting module 20 shown in FIG. 7C will be different from the radiation pattern of the lighting module 20 shown in FIG. 7A, and the same is also true of the radiation patterns of the configurations shown in FIGS. 7B and 7D.

Furthermore, as mentioned above, the angle of rotation may be set in a continuous manner for circular supports 242.

Figure 7E:
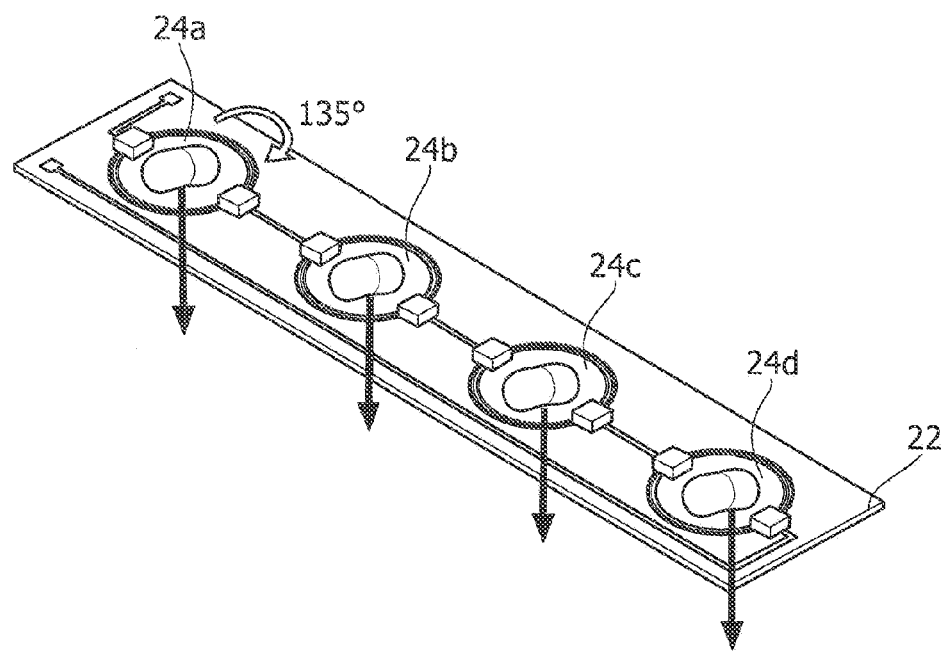

For example, FIG. 7E shows an embodiment in which all the light points 24 have an angle of rotation of 135°.

Finally, it is also possible for each light point 24 to have a different angle of rotation; in other words, the angle of rotation of each light point 24 can be set independently.

Figure 7F:
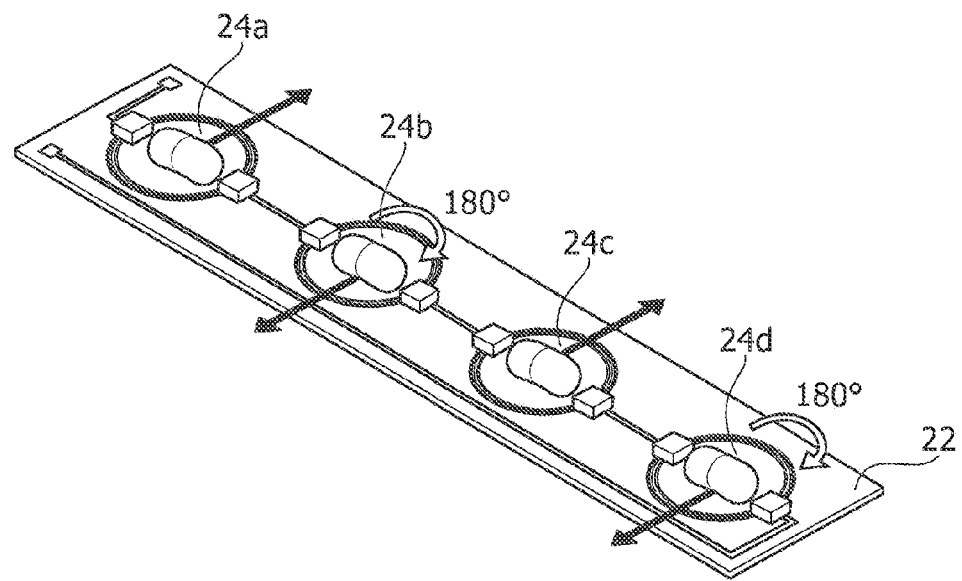

For example, FIG. 7F shows an embodiment in which the first and third light points 24a and 24c have an angle of rotation of 0° and the second and fourth light points 24b and 24d have an angle of rotation of 180°.

Consequently, the solutions described here have numerous advantages, especially the possibility of obtaining different radiation patterns with the same lighting module 20, without any need to change the optical devices, the light sources or their mounting.

Furthermore, solutions using a light point 24 with a circular support 242 allow the orientation of the light point 24 to be changed in a continuous manner without the need to detach components of the lighting module 20. However, owing to the modular structure, it is also possible to use different light points 24 in the same lighting module 20. For example, it would be a simple matter to produce a lighting module 20 comprising light points 24 which emit, red, green and blue light respectively, and/or each light point 24 could have an optical device 248 having a different radiation pattern.

Finally, the solutions described here can be used for any arrangement of light points 24. For example, the solutions described here can be used both in linear LED modules and in LED arrays.

Clearly, provided that the principle of the disclosed embodiments is retained, the details of construction and forms of embodiment can be varied, even to a significant degree, from what has been illustrated herein purely by way of non-limiting example, without thereby departing from the scope of the disclosed embodiments, as defined in the attached claims.

The invention claimed is:

1. A lighting module comprising a base structure and a plurality of light points configured to generate light radiation, wherein said light points are coupled to said base structure, wherein said lighting module comprises at least one light point which has a radiation pattern with rotational asymmetry, and wherein said base structure and said at least one light point are configured to couple said light point to said base structure with different orientations.

2. The lighting module as claimed in claim 1, wherein said light point includes: a support, at least one light source rigidly coupled to said support, wherein said at least one light source is configured to generate said light radiation, and optical means rigidly coupled to said support and arranged in the path of the light radiation generated by said at least one light source, wherein said optical means have a radiation pattern with rotational asymmetry.

3. The lighting module as claimed in claim 2, wherein said light point is rotatable with respect to said base structure.

4. The lighting module as claimed in claim 3, wherein said support of said light point has a circular cross section, and wherein said base structure comprises at least one cavity with a cross section substantially corresponding to the cross section of said support of said light point.

5. The lighting module as claimed in claim 4, wherein said base structure comprises a printed circuit board which comprises said at least one cavity.

6. The lighting module as claimed in claim 5, wherein said lighting module comprises fastening means configured to lock the orientation of said light point.

7. The lighting module as claimed in claim 6, wherein said printed circuit board and said support comprise electrical tracks for powering said at least one light source, and wherein said fastening means are configured to provide the electrical connection between the electrical tracks of said printed circuit board and the electrical tracks of said support.

8. The lighting module as claimed in claim 7, wherein said electrical tracks of said support and said fastening means are configured to provide a sliding contact.

9. The lighting module as claimed in claim 2, wherein said optical means is one of an optical lens and a reflector.

10. The lighting module as claimed in claim 1, wherein said light point comprises at least one LED.

11. An integrated lighting system, comprising a lighting module comprising a base structure and a plurality of light points configured to generate light radiation, wherein said light points are coupled to said base structure, wherein said lighting module comprises at least one light point which has a radiation pattern with rotational asymmetry, and wherein said base structure and said at least one light point are configured to couple said light point to said base structure with different orientations, and an electronic converter for powering said lighting module.

* * * * *